(12) United States Patent
Ducharme et al.

(10) Patent No.: US 7,088,040 B1
(45) Date of Patent: Aug. 8, 2006

(54) LIGHT SOURCE USING EMITTING PARTICLES TO PROVIDE VISIBLE LIGHT

(75) Inventors: Alfred D. Ducharme, Orlando, FL (US); Michael Bass, Orlando, FL (US); Alexandra Rapaport, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 301 days.

(21) Appl. No.: 10/606,551

(22) Filed: Jun. 26, 2003

Related U.S. Application Data

(60) Provisional application No. 60/392,131, filed on Jun. 27, 2002.

(51) Int. Cl.
*H01J 1/62* (2006.01)
*H05B 33/00* (2006.01)

(52) U.S. Cl. .................. 313/512; 445/23
(58) Field of Classification Search ............ 313/512; 257/98–100, 103
See application file for complete search history.

(56) References Cited

U.S. PATENT DOCUMENTS

| | | | |
|---|---|---|---|
| 5,003,179 A | 3/1991 | Pollack | 250/483.1 |
| 5,245,623 A | 9/1993 | McFarlane | 372/69 |
| 5,684,621 A | 11/1997 | Downing | 359/326 |
| 5,698,397 A * | 12/1997 | Zarling et al. | 435/6 |
| 5,764,403 A | 6/1998 | Downing | 359/326 |
| 5,914,807 A | 6/1999 | Downing | 359/326 |
| 5,943,160 A | 8/1999 | Downing | 359/326 |
| 5,956,172 A | 9/1999 | Downing | 359/326 |
| 6,327,074 B1 | 12/2001 | Bass | 359/326 |
| 6,812,500 B1 * | 11/2004 | Reeh et al. | 257/98 |

* cited by examiner

*Primary Examiner*—Joseph Williams
(74) *Attorney, Agent, or Firm*—Brian S. Steinberger; Law Office of Brian S. Steinberger

(57) ABSTRACT

Upconversion methods and devices that converts near-infrared light to the visible spectrum using a rare-earth-doped crystalline host for use as general and decorative lighting. The pseudo-monochromatic output of the processes can be specified by altering the amount and type of rare-earth material used and by selection of an appropriate host. Using rare-earth materials such as ytterbium-erbium or ytterbium-thulium can produce red, green and blue emissions, where the additive mixture of these colors yields a high-quality white light. The materials can be adjusted to achieve white light with any color temperature and high color-rendering index (CRI) for any general and decorative lighting applications both indoors and outdoors.

29 Claims, 11 Drawing Sheets

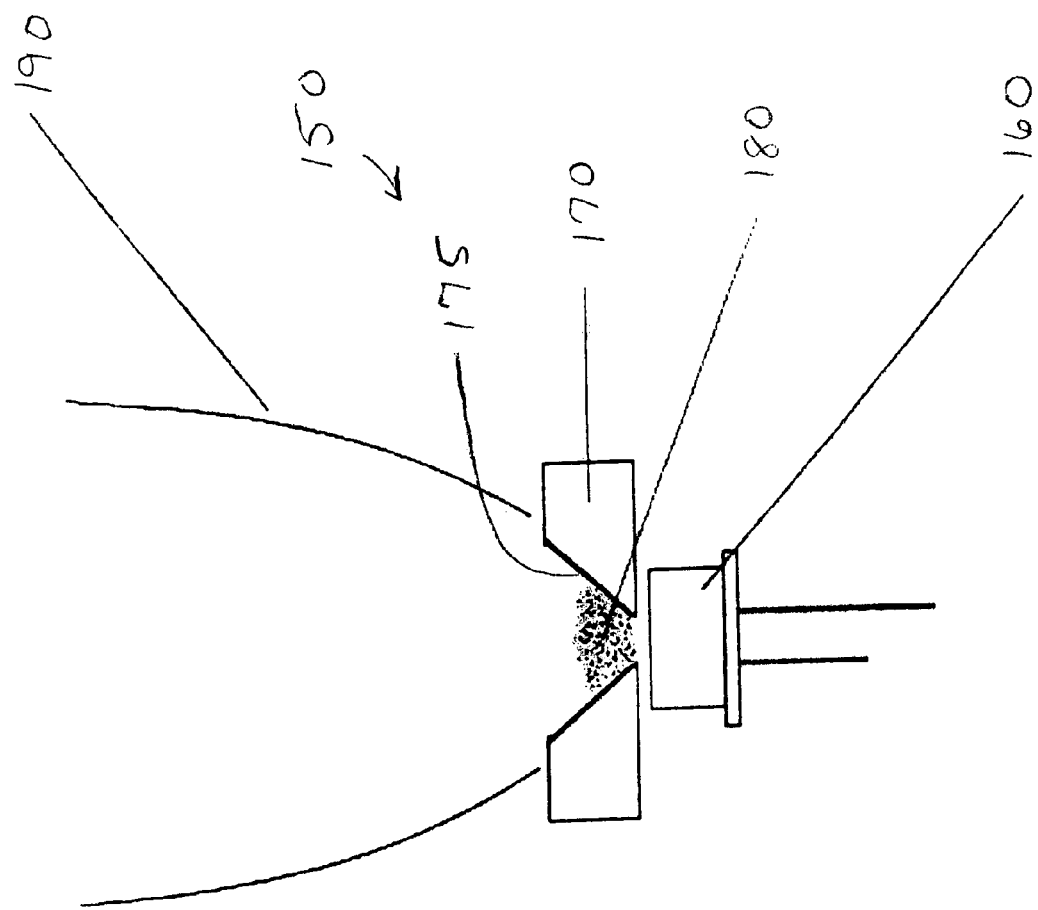

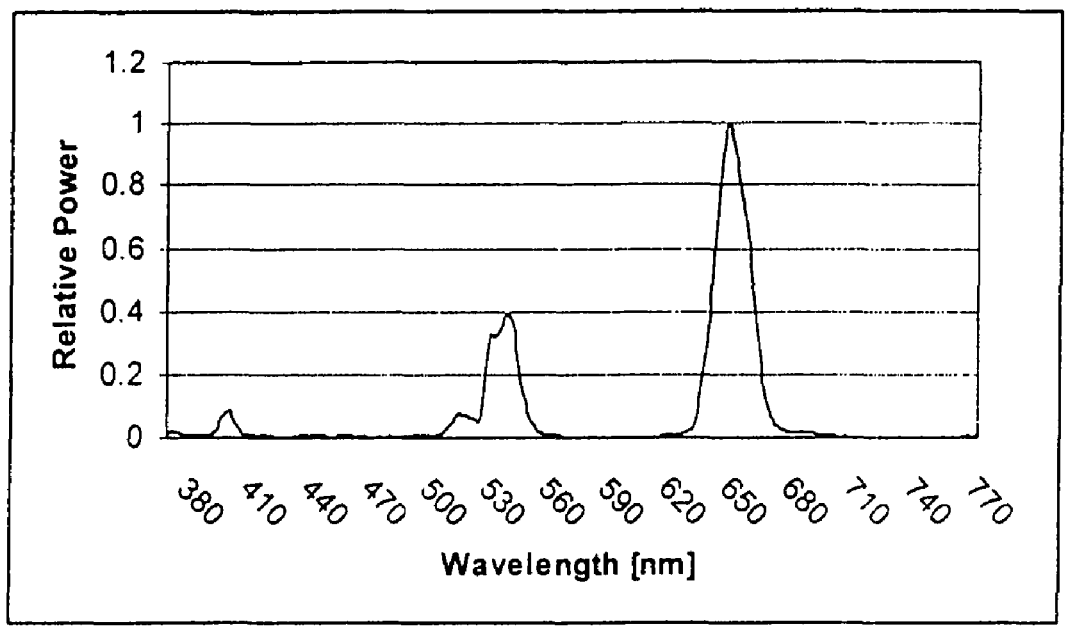
Figure 5. Emission from YF$_3$:Yb,Er with continuous 980nm pump.

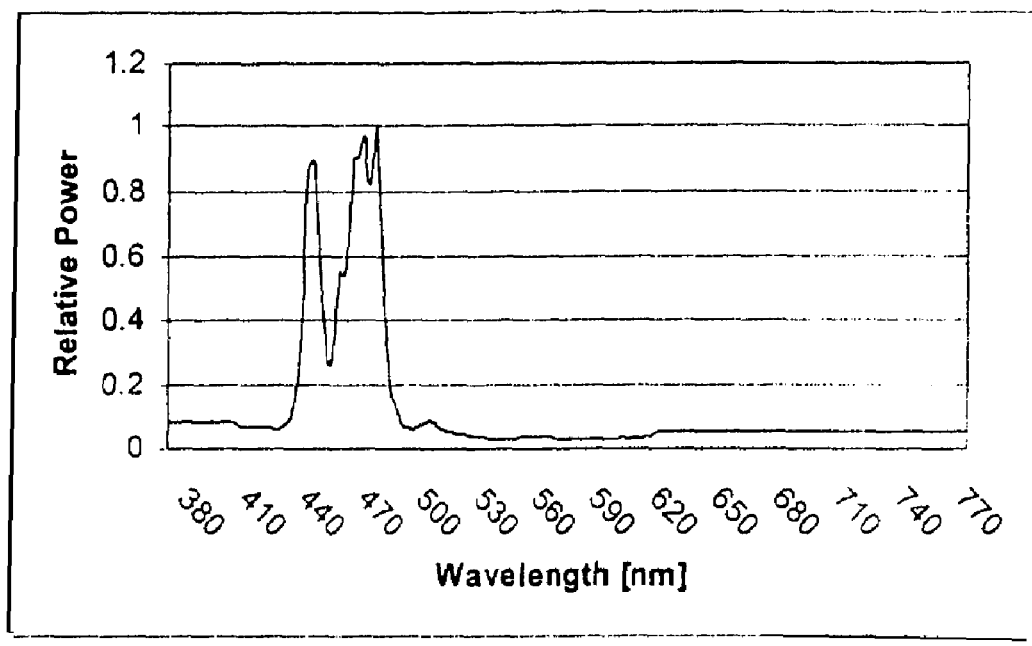
Figure 6. Emission from LiYF$_4$: Th, Yb with continuous 980 pump.

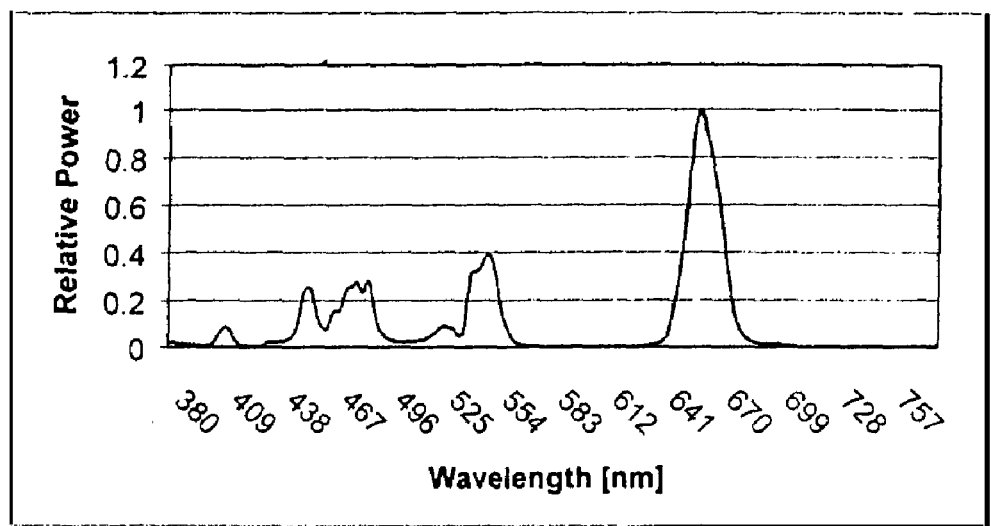
Figure 7. Additive mixture of emissions from YF$_3$:Yb,Er and LiYF$_4$:Th,Yb.

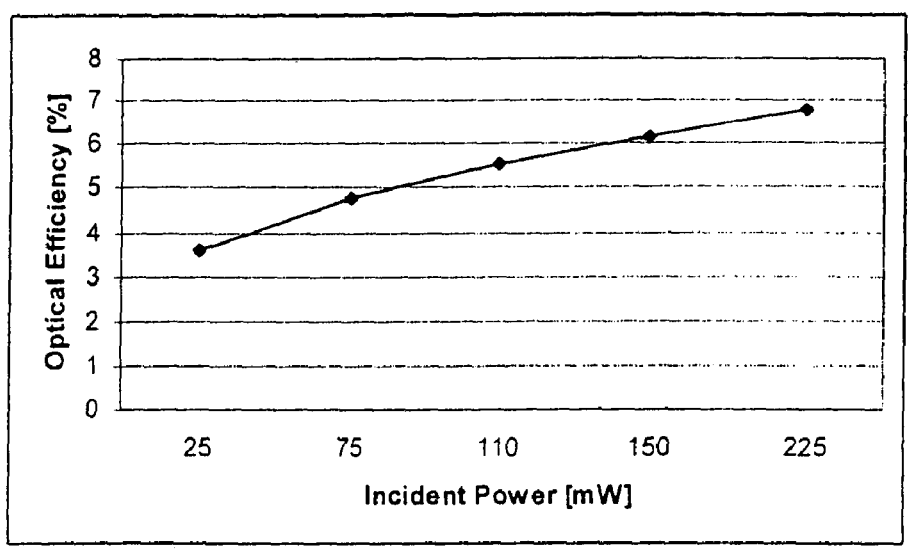
Figure 8. Optical efficiency of the YF$_3$:Yb,Er material scaled to the absorbed power.

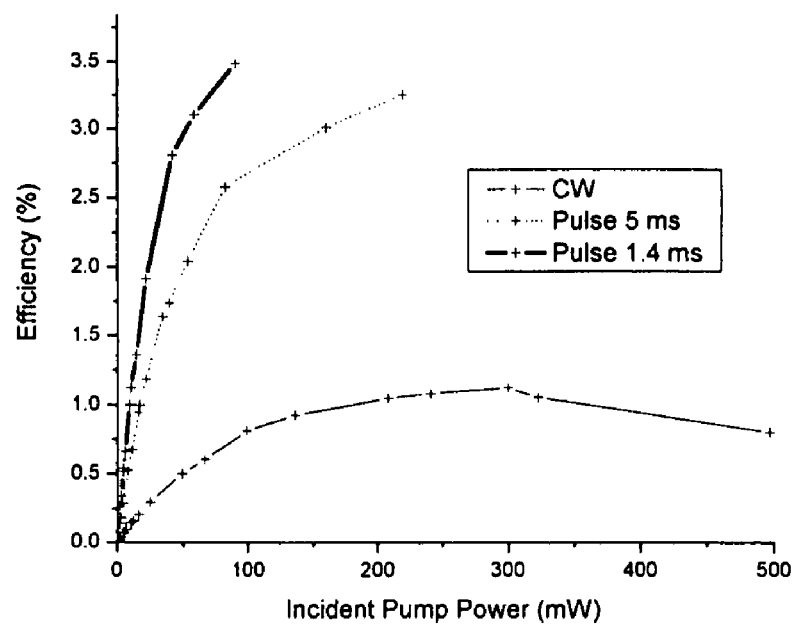
Figure 9: Efficiency of YLiF$_4$:Yb,Tm for different pulse lengths

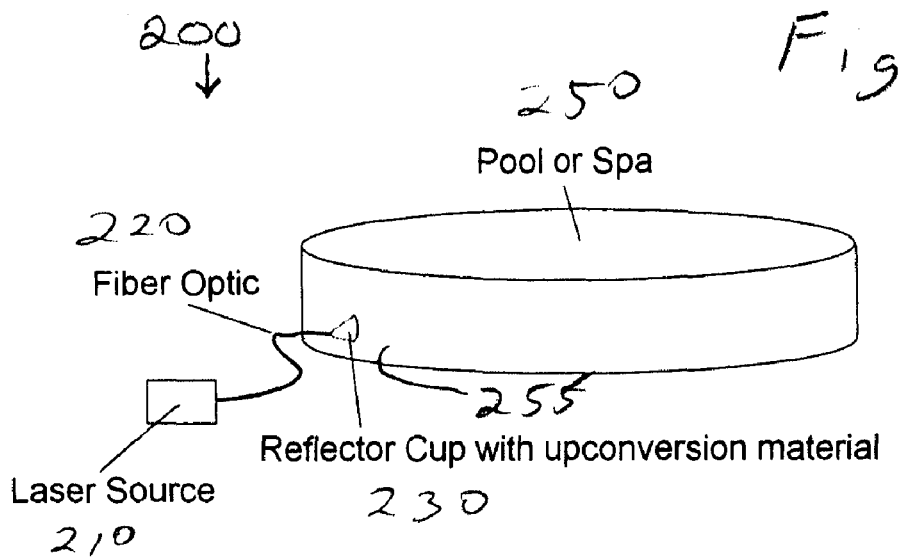
*Pool or Spa Lighting – Colored light and white light applications.*
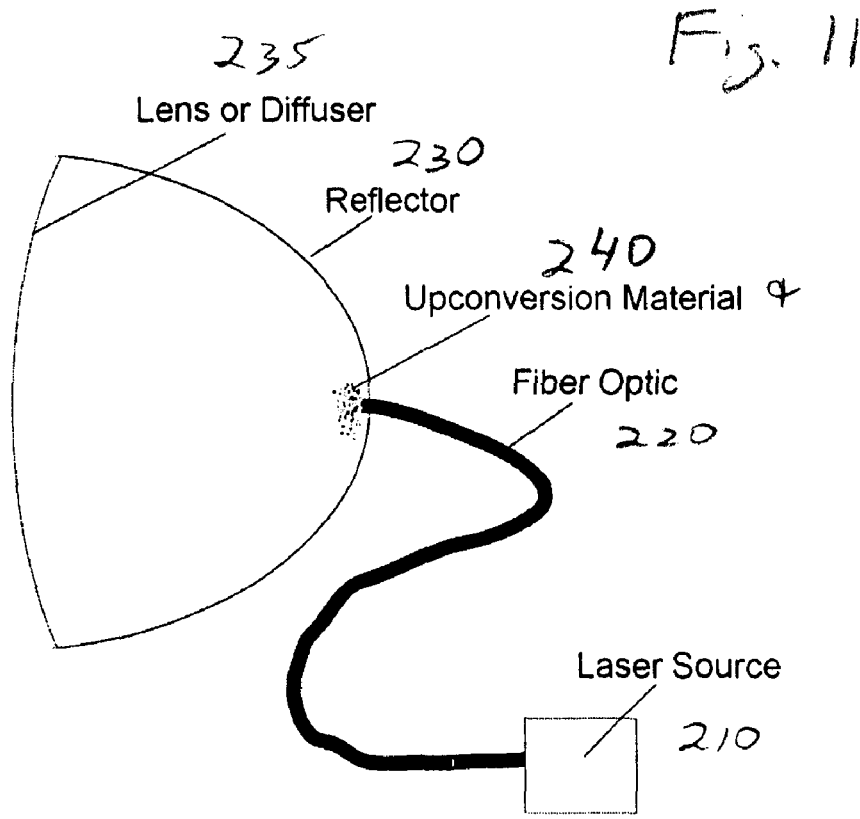

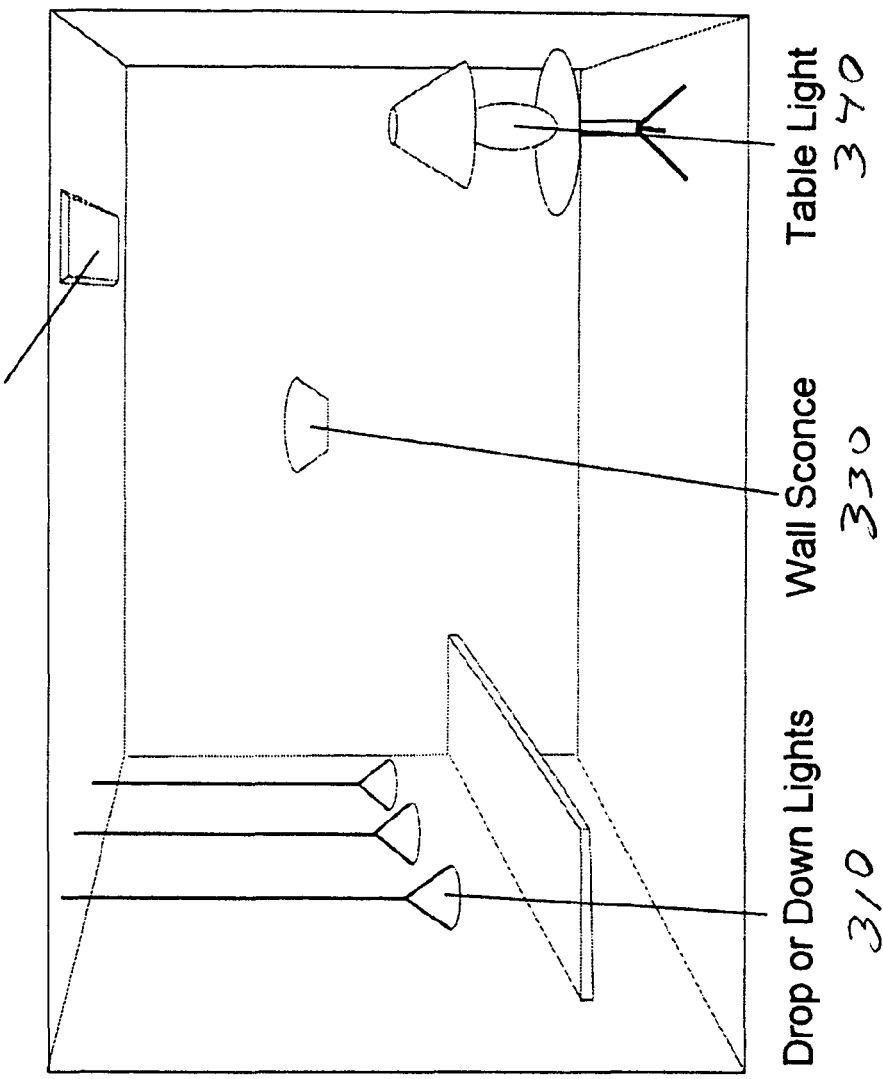

LIGHT SOURCE USING EMITTING PARTICLES TO PROVIDE VISIBLE LIGHT

This invention claims the benefit of U.S. Provisional Patent Application 60/392,131 filed Jun. 27, 2002.

FIELD OF INVENTION

This invention relates to visible light sources, and in particular to methods and devices for forming visible light sources, such as wall and ceiling lights using upconversion of near infrared light with rare earth type particles. This invention relates to U.S. Pat. No. 6,327,074 to Bass et al., by the same assignee as the subject invention, and to U.S. patent application Ser. No. 09/919,131 filed Jul. 31, 2001, to Bass et al. by the same assignee of the subject invention which are both incorporated by reference.

BACKGROUND AND PRIOR ART

Incandescent and fluorescent light sources have been known to be the most popular sources of visible white light. However, these traditional light sources have been known to use electrical energy supplies and give off undesirable amounts of heat when being used.

The Secretary of Energy, Spencer Abraham, at the 13th Annual Energy Efficiency Forum (Jun. 12, 2002) referred to solid-state lighting as an "area of exciting possibilities." He went on to say, "The time has come to take the next step toward solid state lighting" and he used the organic light-emitting diode (OLED) and the light-emitting diode (LED) as examples of solid-state lighting technologies. These devices utilize one of two approaches for generating visible white light. The first approach is to use the additive combination of several wavelengths generated by LEDs such as red, green, and blue to produce white light. The second is to use either ultra-violet (UV) or blue light from an LED to pump a phosphor material to down-convert the light to the visible spectrum, where careful selections of phosphors are required in order to yield white light.

In the solid-state lighting field LEDs and OLEDs are well known sources of providing white visible light for general illumination and as decorative light sources. The highest efficacy LED with the greatest luminous output is the LumiLeds 5 W Luxeon. This LED emits 120 lumens with a 5 W electrical input or 24 lumens/watt. This LED has been in development for 5 years and has had the benefit of millions of dollars of development as general illumination and decorative light sources.

U.S. Pat. No. 6,327,074 to Bass et al., by the same assignee, the University of Central Florida, as the subject invention, describes the use of upconversion materials that can be used in a "Display medium using emitting particles dispersed in a transparent host", where the display mediums are limited to two dimensional and three dimensional display devices. The generation of white light using upconversion materials encapsulated in p-PMMA is also described by the same assignee in a related application, U.S. Ser. No. 09/919,131 to Bass et al. filed Jul. 31, 2001, by the same assignee as that of the subject application and is also limited to being used only in display mediums such as two and three dimensional displays.

To the inventors knowledge, no one uses upconversion materials such as those disclosed in the patents and patent applications of the subject assignee for the generation of white light or colored lights as a visible light source that can be used in general illumination lights sources and/or for decorative light sources.

SUMMARY OF THE INVENTION

The first objective of the present invention is to provide solid state lighting using up-conversion that utilizes a 980 nm laser diode used in telecommunications systems.

The second objective of the present invention is to provide solid state lighting that can use approximately 980 nm laser diodes have an up to approximately 50% or more electrical-to-optical conversion efficiency.

The third objective of the present invention is to provide solid state lighting having a long-life based on semiconductor lasers.

The fourth objective of this invention is to provide solid state lighting that uses low heat based on higher efficiency.

The fifth objective of the present invention is to provide solid state lighting that has overall efficiencies already at 20%.

The sixth objective of the present invention is to provide solid state lighting that uses upconversion materials that can be easily and inexpensively manufactured.

The seventh objective of the present invention is to provide solid state lighting that has little waste in the manufacturing process.

The eighth objective of the present invention is to provide solid state lighting that can be molded into any shape.

The ninth objective of the present invention is to provide solid state lighting that uses true point source emitters so that all generated light is useful.

The tenth objective of the present invention is to provide solid state lighting that is a more efficient alternative to incandescent and fluorescent lighting instead of using OLEDs and LEDs.

The eleventh objective of the present invention is to provide up conversion materials that can be used as general illumination and decorative light sources.

This invention shows that there is another viable solid-state lighting technology using the up-conversion of light to those of the prior art. These results show that in the race for more efficient alternatives to incandescent and fluorescent lighting, up-conversion is a strong competitor to typical OLEDs and LEDs.

The subject invention includes photonics called upconversion. The upconversion process converts near-infrared light to the visible spectrum using a rare-earth-doped crystalline host. The pseudo-monochromatic output of the process can be specified by altering the amount and type of rare-earth material used and by selection of an appropriate host. Using rare-earth materials such as ytterbium-erbium or ytterbium-thulium can produce red, green and blue emissions. The inventors can use a specific recipe of materials to produce red, green, and blue light from infrared light using an upconversion process, where the additive mixture of these colors yields a high-quality white light. The recipe can be adjusted to achieve white light with any color temperature and high color-rendering index (CRI).

Embodiments of the invention can use the visible light source emissions for general and decorative lighting applications. The visible light emissions can be used on portable lamps such as table and floor lamps, ceiling drop directed light sources, ceiling surface mounted light sources, wall type sconce lights, as well as other application such as those used in pools and spas.

Further objects and advantages of this invention will be apparent from the following detailed description of presently preferred embodiments which are illustrated schematically in the accompanying drawings.

BRIEF DESCRIPTION OF THE FIGURES

FIG. 4 shows another upconversion embodiment with a reflector lens.

FIG. 5 shows emission from $YF_3$:Yb,Er with continuous 980 nm pump.

FIG. 6 shows emission from the output of $LiYF_4$:Yb,Tm with continuous 980 pump.

FIG. 7 shows the additive mixture of emissions from $YF_3$:Yb,Er and $LiYF_4$:Yb,Tm.

FIG. 8 shows optical efficiency of the $YF_3$:Yb,Er material scaled to the absorbed power.

FIG. 9 shows efficiency increase with shortening of pulse length.

FIG. 10 shows a pool/spa embodiment that can use the novel upconversion visible light sources.

FIG. 11 is an enlarged view of the unconversion light source used in FIG. 10.

FIG. 12 shows a room using the novel upconversion visible lights for applications as general lighting and decorative lighting sources.

DESCRIPTION OF THE PREFERRED EMBODIMENTS

Before explaining the disclosed embodiments of the present invention in detail it is to be understood that the invention is not limited in its application to the details of the particular arrangement shown since the invention is capable of other embodiments. Also, the terminology used herein is for the purpose of description and not of limitation.

Figure 1:
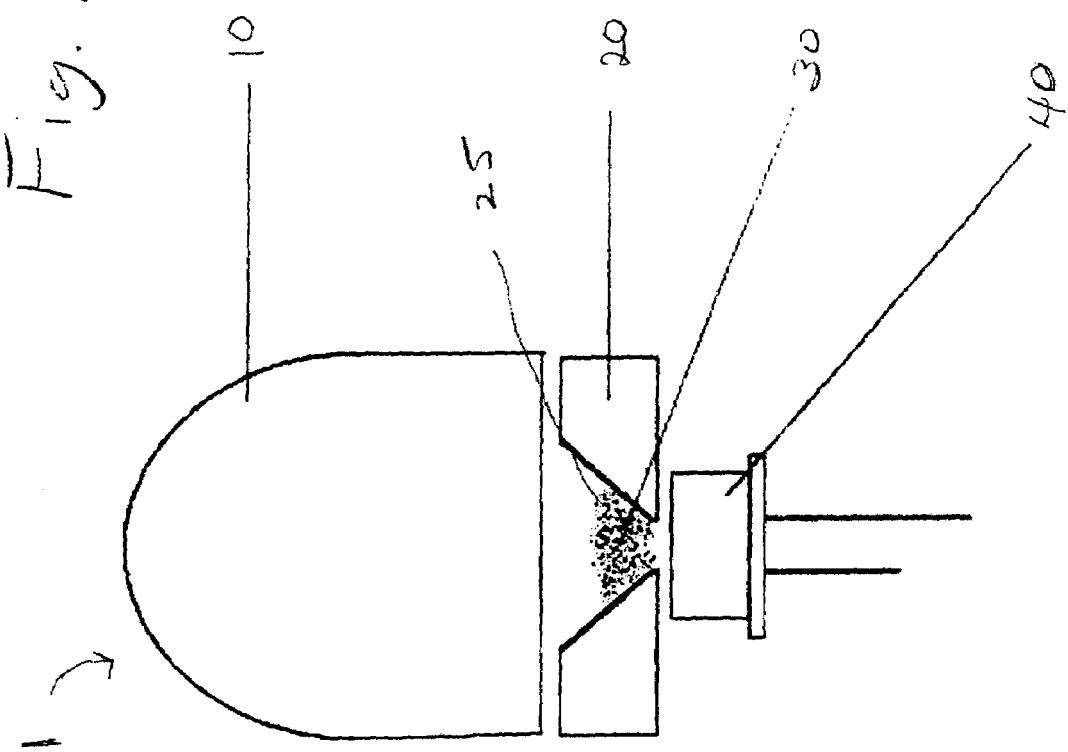
FIG. 1 shows an upconversion embodiment of the invention with conical reflector.

FIG. 1 shows an upconversion embodiment 1 of the invention with conical reflector 25. An approximately 970 to approximately 980 nm diode laser 40 can be used to pump the upconversion material particles (to be described later) within a mixture 30 of the upconversion particles that are encapsulated in p-PMMA(phosphorylated polymethymethacrylate). The upconversion particles then emit a second wavelength dependant on the type of material used. The light of the second wavelength is then reflected by conical reflector 25 such as an aluminum, metal conical reflector and the like, within sample holder 20 and can be directed towards a lens 10 such as an acrylic lens, polycarbonate lens, and the like. The shape of the lens 10 focuses the light of the second wavelength in a selected beam angle.

Figure 2:
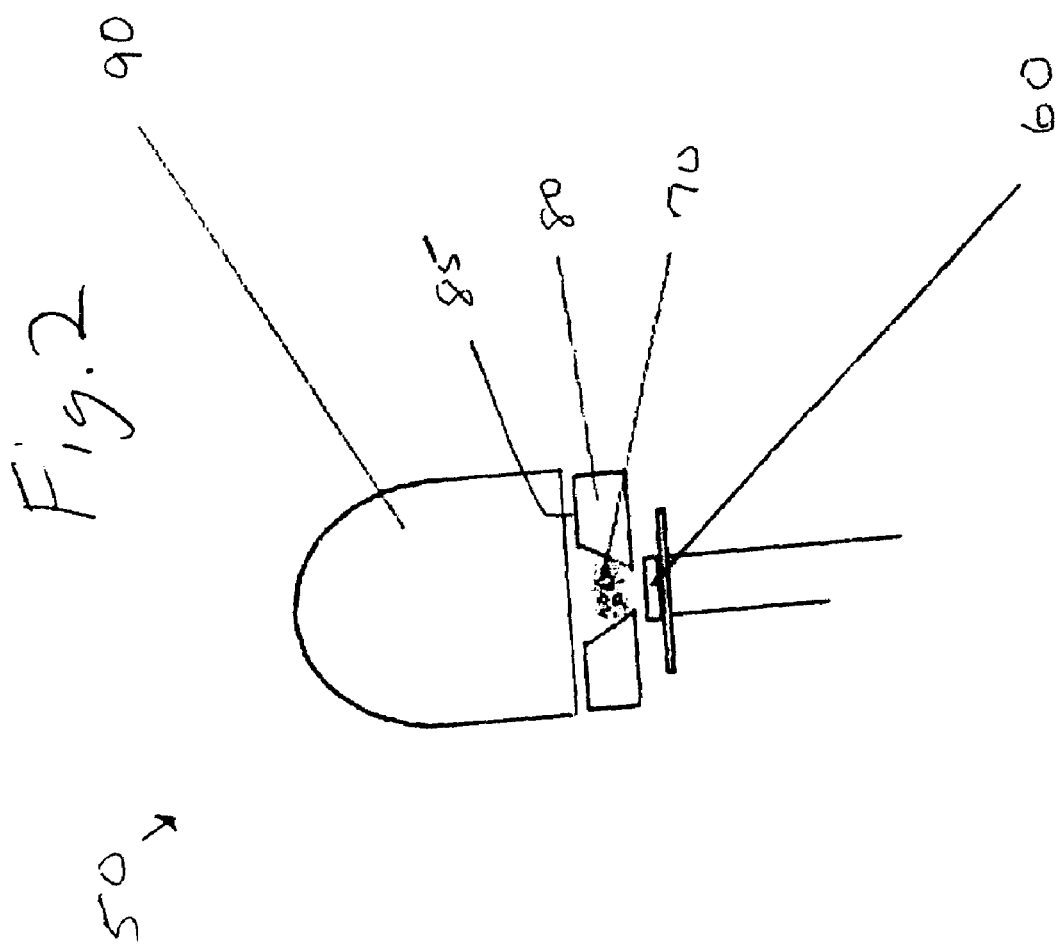
FIG. 2 shows another upconversion embodiment with a reflector cup.

FIG. 2 shows another upconversion embodiment 50 with a reflector cup 85. An approximately 970 to approximately 980 nm light-emitting diode (LED) 60 can be used to pump the upconversion particles that are part of a mixture 70 of the upconversion particles that are encapsulated in p-PMMA. The upconversion particles then emit a second wavelength dependant on the type of material used. The light of the second wavelength can then be reflected by a reflector cup 85 such as an aluminum, metal reflector cup, and the like, and are directed towards the lens 90 such as an acrylic lens, polycarbonate lens, and the like. Similar to the lens in FIG. 1, the shape of the lens 90 in FIG. 2 can focus the light of the second wavelength in the desired beam angle.

Figure 3:
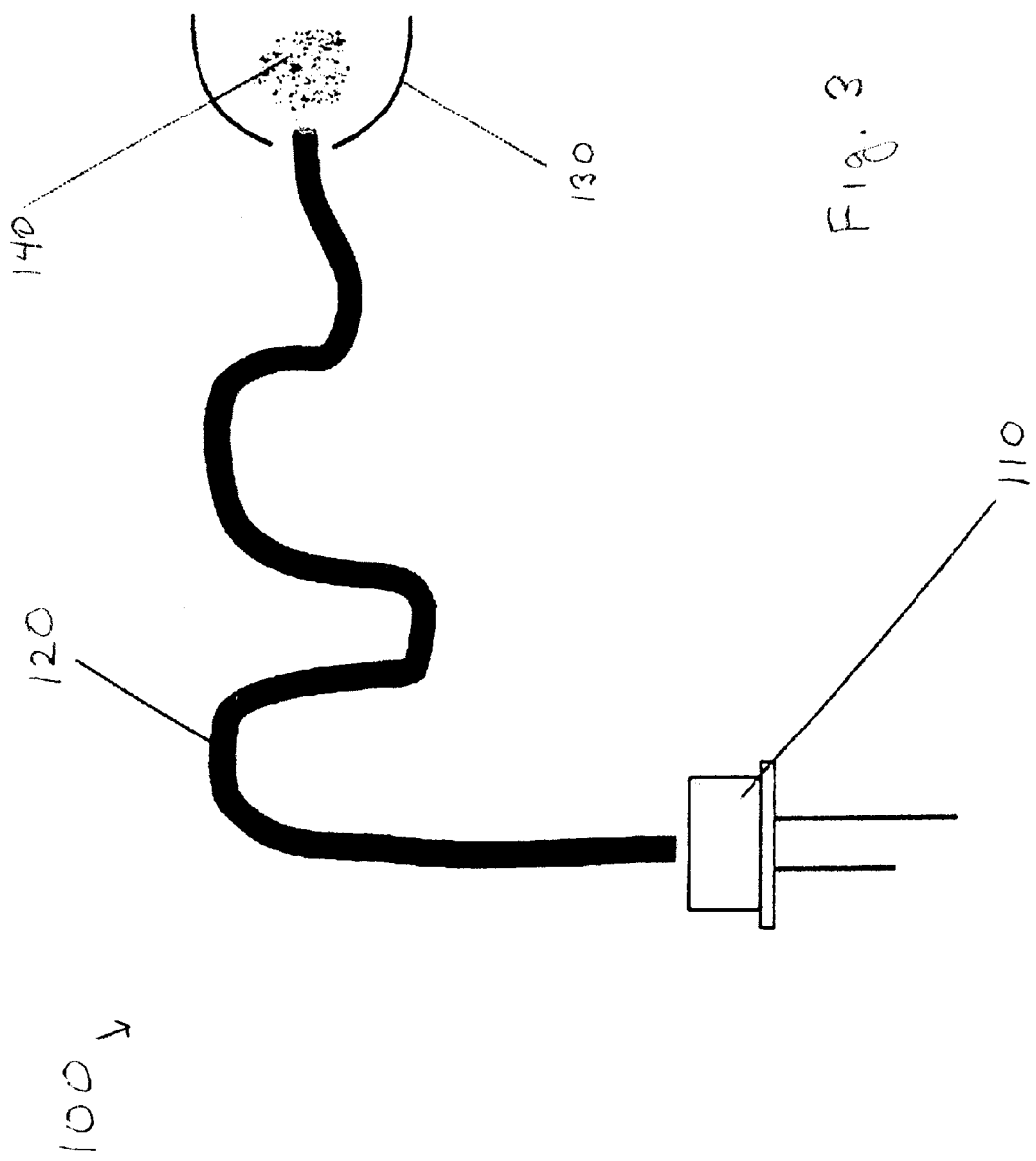
FIG. 3 shows the output of a diode laser coupled to a waveguide.

FIG. 3 shows an embodiment 100 of the output of a diode laser 110 coupled to a waveguide 120. The output of an approximately 970 to approximately 980 nm diode laser 110 can be coupled into a waveguide 120, such as a planer (e.g., flat glass), optical fiber, and the like. The waveguide 120 delivers the near-infrared pump light to the upconversion particles that are in the mixture 140 of the upconversion particles encapsulated in p-PMMA. The upconversion particles then emit a second wavelength dependant on the type of particles used. The light of the second wavelength is then reflected and directed by a reflector 130 such as a parabolic, compound parabolic concentrator (CPC), or reflector cup, and the like.

FIG. 4 shows another upconversion embodiment 150 with a reflector 190. An approximately 970 to approximately 980 nm diode laser 160 can be used to pump the upconversion particles within a mixture 180 of the upconversion particles encapsulated in p-PMMA. The upconversion particles then emit a second wavelength dependant on the type of material used. The light of the second wavelength is then reflected by a reflector 175, such as a conical reflector, reflector cup, and the like, within a sample holder 170 and directed towards the outer reflector 190. The outer reflector 190 can be a parabolic, compound parabolic concentrator (CPC), and the like. The shape of the outer reflector 190 can focus the light of the second wavelength in the desired beam angle.

An aspect of the invention has been in the encapsulation of the upconversion materials in a manufacturable form. The crystal materials once doped are crushed and then milled into a fine powder consisting of particles in the approximately 10 to approximately 50 micron size range. The index of refraction of these particles is approximately 1.45 and therefore reflects much of the incident pump light in air. In addition, the jagged surface features decrease the overall efficiency since this contributes to the amount of light that is reflected.

Table 1 shows a preferred list of upconversion particles that include host materials with dopant concentrations, that can be used for generating various visible light emissions.

TABLE 1

| Emitted color | Host material | Dopant concentrations | | Known efficiency |
|---|---|---|---|---|
| green | $NaYF_4$ | 0.5% → 5% Er | 10% → 40% Yb | 26 Lm/W |
| red | $YF_3$ | 0.5% → 5% Er | 10% → 40% Yb | 3 Lm/W |
| blue | $YLiF_4$ | 0.2% → 3% Tm | 10% → 40% Yb | 3 Lm/W |
| | $YF_3$ | 0.2% → 3% Tm | 10% → 40% Yb | |

The upconversion particles of Table 1 can be mixed with encapsulation materials, such as p-PMMA(phosphorylated polymethymethacrylate), index matched PMMA derivative, phosphorylated-PMMA and index-matched version, solgels, and the like.

The encapsulation materials can be injection molded into any shape using conventional plastic molding techniques. The p-PMMA, for example, can have an index of refraction that can be adjusted to optimally match the index of the crystal particles. This increases the absorbed pump light and subsequently increases the overall optical-to-optical efficiency of the materials.

The exact concentration of rare-earth to host materials can be optimized as needed. A preferred example can use a host of yttrium fluoride ($YF_3$) doped with a large amount of ytterbium (Yb) and a small amount of erbium (Er) to yield an emission with peaks at approximately 540 nm and approximately 660 nm. The output of this material with a pump laser at approximately 980 nm is shown in FIG. 5 which shows emissions from YF3:Rb,Er with continuous approximately 980 nm pump.

This upconversion material can provide emissions at both the red and green wavelengths. The human eye perceives the combined output of these peaks as an orange light. White light can be obtained by adding blue to the mixture using another upconversion material. The blue emission can be generated using a host of lithium yttrium fluoride (LiYF$_4$ also referred to as YLF) with a doping of thulium (Tm) and ytterbium (Yb). The output of LiYF$_4$ is shown in FIG. 6 which shows emissions with continuous approximately 980 nm pump.

The combination of YF$_3$:Yb,Er and LiYF$_4$: Yb,Tm with an appropriate ratio will yield a white light emission. FIG. 7 shows the additive mixture of emissions from YF$_3$:Yb,Er and LiYF$_4$: Yb,Tm. The spectrum shown in FIG. 7 can be perceived as white light with an approximate color temperature of approximately 6000K.

An important factor for determining the technical feasibility of any lighting technology is its efficiency. Efficiency can be described in many ways but in the lighting world one definition is widely accepted and that is efficacy. This quantity can be defined as the luminous output divided by the electrical power used, or lumens per watt. FIG. 7 shows that in fact the upconversion materials can be used to generate white light but it doesn't show how efficient the process is. For this discussion a few more concepts must be understood regarding the characteristics of the upconversion material.

The first is that the upconversion materials emit more light as the pump intensity increases. In fact, the emitted power increases as the square of the intensity. This occurs until the material is saturated. Therefore, the efficiency of the material plateaus or saturates a measurable intensity. Pumping the material past the saturation intensity is simply wasted power.

The second interesting characteristic of these materials is that they continue to emit light once the pump light is discontinued. This persistence allows the material to be pumped up to the saturation point and then allowed to relax. Once the light output drops to a noticeable level the pump can be turned back on. This pulsing ability will be discussed in more detail later as a potential means of increasing efficacy.

The third characteristic that needs to be understood is that because the particles reflect light much of the incident pump power is not utilized. Presently this hinders our measurements since we can only measure the efficiency with respect to the incident power. Next, there will be discussion on how this unused pump power can be recycled and used to increase efficiency.

The data plotted in FIG. 8 shows the efficiency of the YF$_3$:Yb,Er material defined as the optical output divided by the absorbed optical input power.

From this plot we can calculate the efficacy of the overall system based on an approximate 7% optical efficiency. A standard approximately 980 nm laser diode has an electrical-to-optical efficiency of approximately 50%. An optical pump equivalent to approximately 25 watts can be generated from an approximately 50 watt electrical power consumption by a laser diode (actually an array for this level of power). Approximately, 120 lumens of light is generated based on the optical efficiency of approximately 7%. This equates to approximately 120 lumens for an electrical input of approximately 50 watts or approximately 2.4 lumens/watt. However, only approximately 50% of the pump light is used in the measurement shown in FIG. 8 meaning that if the unused pump could be recycled an overall efficacy of approximately 5 lumens/watt could be achieved.

The subject invention optimizes the efficacy of the upconversion materials. We have three main objectives: optimization of rare-earth-doping, increasing the amount of pump light utilized, and the investigation of pulsing effects.

Optimization of Concentrations

Table 1 above shows various upconversion materials that have been demonstrated to emit different visible light emissions. Further optimization can establish green/red upconversion material and a blue upconversion material that yield the highest possible efficiency.

Pump Light Usage

Several optical configurations can be used for pumping the upconversion materials referenced above. Optical raytrace software such as ASAP can be used to further narrow the possible number of configurations which can be further tested for efficiency.

Pulsing Effects

An experiment was performed to show that pulsing of the pump power can dramatically increase the overall efficiency of the upconversion materials. Our initial tests for the blue material show that an increase of a factor of approximately 4(four) in efficacy is possible with short duration pulsing on the order of several milli-seconds. This equates to an efficacy of approximately 3 lumens/watt in the blue and red, and 26 lumens/watt in the green for our technology at this time.

We have performed an experiment to show that pulsing can increase the efficiency of the blue emitting material. The experiment showed that using continuous wave pumping (no pulsing) the YLiF$_4$:Yb, Tm sample provides approximately 0.9% efficiency in the blue portion of the spectrum. The pump laser was then pulsed at approximately 33 Hz with an approximately 1.4 ms pulse. The efficiency increased by a factor of approximately 4 to approximately 3.6%. Simulations show that that this factor increases as the pulse length is shortened until a pulse length of about 700 microsecond. When the pulse is shortened below 700 microsecond, the efficiency does not improve any further. The results of this experiment are plotted in FIG. 9 for various pulse lengths. These results are in good agreement with the numerical simulations performed.

Energy Benefits

The installed unit for the invention is initially approximately 10% of the total lighting market. The total consumption of electricity by lighting in the United States was approximately 600 million kWhr in year 2001. Initially, the cost of the invention can be higher when compared to incandescent and fluorescent lighting. As a result, the upconversion white light will begin to penetrate the lighting market in niche sectors where long-life and high efficiency will make it acceptable despite the high initial cost. We estimate 5% market penetration within 5 years of its introduction. This equates to approximately 30 million kWhr of the total 600 Million kWhrs used for lighting. The expected efficiency is approximately two times higher than traditional light sources. Therefore, approximately 15 Million kWhr of electricity will be saved using the upconversion technology. This is equals a savings of 50 Trillion BTUs per year.

FIG. 10 shows a pool/spa embodiment 200 that can use the novel upconversion visible light sources for either or both general lighting sources and decorative lighting sources. FIG. 11 is an enlarged view of the unconversion light source used in FIG. 10. Referring to FIGS. 10–11, a pool/spa enclosure 250 can use the novel light sources that can emit visible white light and/or colored light through the sidewalls 255 of the pool/spa enclosure 250. A laser source 210, such as a laser diode previously described, can emit through a waveguide 220 such as an optical fiber which passes the light into a mixture 240 of upconversion materials/particles and encapsulation material, previously described. Visible light can be reflected from a reflector 230 such as a parabolic reflector, and the like, out through a transmission medium 235, such as a lens, diffuser, and the like, into the pool/spa enclosure 250. As previously described, visible light can be visible white light, colored light, various mixes, and the like.

FIG. 12 shows a room embodiment 300 using the novel upconversion visible lights for applications as general lighting and decorative lighting sources. Here, the novel upconversion visible emission lighting devices previously described can be used indoors suspended from a ceiling in drop or down lights housed in downwardly directed enclosures 310, on ceiling surface or in ceiling trough lighting 320, as visible lighting in wall sconces 330, and also in table lighting applications 340, such as in a portable table lamp, floor lamp, and the like, where a typical shade can be used.

The novel invention has a wide variety of applications in residential and commercial uses for applications as general lighting sources, decorative lighting sources, and the like, and can be used in outdoor as well as any indoor applications as needed.

Other applications for the invention can be for use in automotive headlights, where the infrared generated visible source light can be used to flood a selected area in front of or behind a vehicle. An onboard infrared camera can then be aided by the infrared generated visible source light. The generated visible light can be reflected and/or focused away from the vehicle for enhanced vision when driving during night-time, or storm or fog or smoke or haze conditions.

The invention can have other applications where the user would want visible light unless they were wearing night-vision goggles. In this case the user would see a display with the un-aided eye and the infrared source light using their night vision goggles.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method of forming visible light sources with up conversion materials, comprising the steps of:
   generating near infrared light from a source;
   upconverting the near infrared light through a an encapsulated mixture of upconversion materials located in a sample holder having a reflective surface into a visible light emission dependant on the type of upconversion material used, wherein the near infrared light is unconverted to the visible light emission;
   reflecting the visible light emission off the reflective surface; and
   applying the reflected visible light emission to a light fixture for at least one of a general lighting source or a decorative lighting source.

2. The method of claim 1, wherein the generated near infrared light is emitted from a diode laser.

3. The method of claim 2, wherein the diode laser includes an approximately 970 to approximately 980 nm diode laser source.

4. The method of claim 1, wherein the upconversion materials are encapsulated in p-PMMA.

5. The method of claim 1, wherein the visible light emission includes: red light.

6. The method of claim 1, wherein the visible light emission includes: green light.

7. The method of claim 1, wherein the visible light emission includes: blue light.

8. The method of claim 1, wherein the visible light emission includes: white light.

9. The method of claim 1, wherein the mixture of upconversion materials includes:
   yttrium fluoride ($YF_3$) doped with ytterbium (Yb) and erbium (Er).

10. The method of claim 1, wherein the mixture of upconversion materials yields emissions with peaks at approximately 540 nm and approximately 660 nm.

11. The method of claim 1, wherein the mixture of upconversion materials includes: rare-earth material.

12. The method of claim 1, wherein the mixture of upconversion materials includes:
    ytterbium-erbium.

13. The method of claim 1, wherein the mixture of upconversion materials includes:
    ytterbium-thulium.

14. A method of forming visible light using upconversion comprising the steps:
    providing near-infrared light; and
    upconverting the near-infrared light with a rare-earth-doped crystalline host as upconversion particles to produce a visible light;
    reflecting the visible light from a reflector onto a lens, wherein a shape of the lens focuses the reflected visible light in a beam angle; and
    applying the reflected visible light to a light fixture as a general lighting source or decorative lighting source, wherein the near infrared light is unconverted to the visible light emission.

15. The method of claim 14, wherein the visible light includes: visible red light.

16. The method of claim 14, wherein the visible light includes: visible green light.

17. The method of claim 14, wherein the visible light includes: visible blue light.

18. The method of claim 14, wherein the visible light includes: visible white light.

19. The method of claim 14, wherein the rare earth doped crystalline host includes: $NaYF_4$ doped with Er and Yb.

20. The method of claim 14, wherein the rare earth doped crystalline host includes: $YF_3$ doped with Er and Yb.

21. The method of claim 14, wherein the rare earth doped crystalline host includes: $YLiF_4$ doped with Tm and Yb.

22. The method of claim 14, wherein the rare earth doped crystalline host includes: $YF_3$ doped with Tm and Yb.

23. An upconversion visible light source for general and decorative lighting, comprising:
    means for generating near infrared light from a source;
    upconversion materials for upconverting the near infrared light into a visible light emission;
    a reflector for reflecting the visible light emission; and
    a means for focusing the visible light emission into a light fixture as at least one of a general lighting source or a decorative lighting source.

24. The upconversion visible light source of claim 23, wherein the generating means includes: a laser diode.

25. The upconversion visible light source of claim 23, wherein the upconversion materials include: rare earth doped crystalline host particles mixed within encapsulation materials.

26. The upconversion visible light source of claim 25, wherein the visible light emission includes: visible white light.

27. The upconversion visible light source of claim 25, wherein the visible light omission includes: visible red light.

28. The upconversion visible light source of claim 25, wherein the visible light emission includes: visible green light.

29. The upconversion visible light source of claim 25, wherein the visible light emission includes: visible blue light.

* * * * *